(12) United States Patent
Kimura et al.

(10) Patent No.: US 8,196,292 B2
(45) Date of Patent: Jun. 12, 2012

(54) METHOD FOR HOLDING AND CARRYING SUBSTRATE

(75) Inventors: Akihiro Kimura, Tochigi-ken (JP); Osamu Deguchi, Tochigi-ken (JP); Koji Annou, Tochigi-ken (JP); Atsushi Ishikawa, Tochigi-ken (JP)

(73) Assignee: Daisho Denshi Co., Ltd., Tokyo (JP)

( * ) Notice: Subject to any disclaimer, the term of this patent is extended or adjusted under 35 U.S.C. 154(b) by 362 days.

(21) Appl. No.: 12/548,863

(22) Filed: Aug. 27, 2009

(65) Prior Publication Data
US 2010/0050430 A1      Mar. 4, 2010

Related U.S. Application Data

(62) Division of application No. 10/598,251, filed on Apr. 3, 2007, now Pat. No. 7,600,313.

(30) Foreign Application Priority Data

Feb. 24, 2004   (JP) .................................. 2004/047568

(51) Int. Cl.
*H05K 3/36* (2006.01)
(52) U.S. Cl. .......................................... 29/830; 29/832
(58) Field of Classification Search .................. 29/830, 29/593, 825, 829, 832, 852; 118/223, 239, 118/248, 255, 261; 257/678, 787, 788; 411/15, 411/508, 510, 913
See application file for complete search history.

(56) References Cited

U.S. PATENT DOCUMENTS

| | | | |
|---|---|---|---|
| 3,756,115 A | * | 9/1973 | Schuplin ........................ 411/508 |
| 3,905,570 A | * | 9/1975 | Nieuwveld ...................... 248/71 |
| 4,292,116 A | | 9/1981 | Takahashi et al. |
| 4,470,737 A | * | 9/1984 | Wollar ........................... 411/508 |
| 4,731,923 A | | 3/1988 | Yagi et al. |

(Continued)

FOREIGN PATENT DOCUMENTS

EP      0208492 A2      1/1987

(Continued)

OTHER PUBLICATIONS

International Searching Authority/Japan, Search Report and Written Opinion in Application No. PCT/JP2004/010148, Sep. 14, 2004, 10 pages.

(Continued)

*Primary Examiner* — Thiem Phan
(74) *Attorney, Agent, or Firm* — Wood, Herron & Evans, LLP

(57) ABSTRACT

A part cartridge for a mounter device used in a mounting process for mounting electronic parts on a substrate by heating the substrate to a predetermined temperature after the electronic parts are mounted on the substrate put on a conveying carrier by the mounter device, comprising holding part holding the substrate in the state of being fitted to the conveying carrier, and a guide tape holding the holding part. The holding member is stored in the state of being wound together with the guide tape so that the holding part can be mounted on the conveying carrier by the mounter device. By this, a method of holding and carrying the substrate for mounting the holding part on the conveying carrier by using the mounter device can be adopted in the mounting process. The deflection of the substrate in reflow can be securely prevented while suppressing cost by effectively utilizing the existing mounting line and devices.

4 Claims, 5 Drawing Sheets

U.S. PATENT DOCUMENTS

| | | |
|---|---|---|
| 5,136,827 A | 8/1992 | Sawaya |
| 6,485,567 B2 * | 11/2002 | Obana et al. .......... 118/223 |
| 2002/0124396 A1 | 9/2002 | Wark et al. |

FOREIGN PATENT DOCUMENTS

| | | |
|---|---|---|
| JP | 59073243 | 4/1984 |
| JP | 2137297 | 5/1990 |
| JP | 3190200 | 8/1991 |
| JP | H04-123495 | 4/1992 |
| JP | 8279699 | 10/1996 |
| JP | 9321491 | 12/1997 |
| JP | 2003142898 | 5/2003 |
| KR | 1990-1568 | 2/1990 |
| WO | 03067950 A1 | 8/2003 |

OTHER PUBLICATIONS

Office Action issued Mar. 11, 2008 in Korean Patent Application No. 10-2006-7016714, 4 pages.

Japanese Patent Office, Japanese Office Action in counterpart JP Application Serial No. 2006-510147 issued Jan. 13, 2009, 4 pages.

European Search Report, European Patent Office Application No. 04747614.8 dated Jul. 15, 2010.

* cited by examiner

METHOD FOR HOLDING AND CARRYING SUBSTRATE

CROSS-REFERENCE TO RELATED APPLICATIONS

This application is a divisional of U.S. patent application Ser. No. 10/598,251 entitled "PART CARTRIDGE FOR MOUNTER DEVICE", filed Apr. 3, 2007 now U.S. Pat. No. 7,600,313, which is a U.S. National Phase under 35 U.S.C. 371 of International Application PCT/JP04/10148, filed Jul. 9, 2004, which claims priority to Japanese Patent Application No. 2004-47568, filed Feb. 24, 2004, the disclosures of which are hereby incorporated by reference herein.

TECHNICAL FIELD

The present invention relates specifically to a mounter device, a part cartridge for the device, and a method of holding and carrying substrate, which are favorably used during the manufacture of electronic circuit boards using especially thin printed circuit boards.

BACKGROUND ART

Conventionally, electronic circuit boards were manufactured by mounting electronic parts on the substrate placed and held in the conveying carrier and the substrate heated to the predetermined temperature in the reflow oven. To prevent the occurrence of deflection in the substrate due to thermal stresses during reflow and to improve the yield of the electronic circuit boards during this manufacturing stage, the technology, for instance, disclosed in the Japanese Unexamined Patent Application, First Publication No. 2003-142898, of holding down arbitrary locations of the fringes and the central part of the substrate in close contact with the conveying carrier to prevent the board from being raised above the conveying carrier, was used.

However, when manufacturing the electronic circuit boards using thin printed circuit boards such as thin PWB or FPC substrate, the method of coating resin material with low adhesiveness on the base material of the conveying carrier, and holding the substrate by the adhesive force of the resin material, or the method of fixing the conveying carrier using tape or weight on the fringes of the substrate, were often adopted.

The methods mentioned above had issues however, such as the ones described below. Firstly, in the method of adhesion and holding of the substrate, the force occurring due to thermal stresses during reflow of the substrate sometimes exceeds the adhesive force of the conveying carrier, and the deflection in the substrate cannot be prevented. Moreover, in the method for fixing the substrate using tape or weight, the costs may increase because of the increase in the man-hours. Furthermore, when a metallic weight is used, this weight absorbs heat during reflow. As a result, the temperature distribution of the substrate surface becomes non-uniform, which may cause unevenness in the molten solder.

Particularly in recent years, with the increasing use of small data recording media and IC cards by general consumers, the demand for electronic circuit boards using very thin substrates has grown rapidly. In these electronic circuit boards, halogen-free substrates and lead-free solder are often used based on the environmental measures mainly adopted in Europe. However, in view of these measures, deflection occurs comparatively easily during reflow in halogen-free substrates, and the melting temperature of lead-free solder is comparatively high; therefore, these measures are disadvantageous considering deflection prevention of substrates. Furthermore, there is a trend these days to make the substrates used in such electronic circuit board thinner, and the cost of these substrates also creates very severe conditions for their manufacture.

The present invention has the object of preventing deflection during reflow of substrate by effectively using existing mounting lines and devices and by restricting costs after considering the circumstances mentioned above.

DISCLOSURE OF THE INVENTION

To resolve the disadvantages mentioned above, the present invention provides a part cartridge for a mounter device used in the mounting process for mounting electronic parts on a substrate by heating the substrate to a predetermined temperature after the electronic parts are mounted on the substrate placed and held on a conveying carrier by the mounter device. This mounter device comprises a holding part for holding the substrate in close contact with the conveying carrier, and a guide tape for holding the holding part. The part cartridge contains the holding parts held by the guide tape in would condition so that the holding part can be mounted on the conveying carrier by the mounter device.

By using the part cartridge for the mounter device and by using the mounter device formed by fitting the part cartridge, the method of holding and carrying a substrate in which the holding pins are fitted by the mounter device to the conveying carrier can be adopted.

According to the method for holding and carrying substrates mentioned above, even if thermal stresses occur in the substrate after heating, the substrate is held in close contact with the conveying carrier by the holding part. Thus, the rise of the substrate from the conveying carrier, namely the deflection of the substrate can be securely prevented.

The electronic circuit board formed by mounting electronic parts on the substrate can be manufactured by using existing mounting lines and devices, and at the same time, the holding pins can be automatically fitted at high speed using the existing mounter device.

In the method of holding and carrying substrate mentioned above, a predetermined latching force is generated between the holding part and the conveying carrier when the holding part is inserted while brought into sliding contact elastically with the conveying carrier. Thus, if the latching force is set such that it can hold the substrate at a holding force that just exceeds the force generated by thermal stresses in the substrate during heating, then deflection of the substrate can be prevented and the holding part can be easily fitted and removed from the conveying carrier, Furthermore, in the method of holding and carrying substrate mentioned above, if the holding part is disposed so as to hold the fringes of the substrate, the fringes (outer edges) of the substrate that is likely to rise from the conveying carrier can be held firmly in close contact with the conveying carrier, and the deflection of the substrate can be effectively prevented. Here, the fringes of the substrate include internal edges such as edges of holes and slits provided on the substrate (including the state of the base material before the formation of the substrate) in addition to the fringes mentioned above.

BEST MODE FOR CARRYING OUT THE INVENTION

Figure 1:
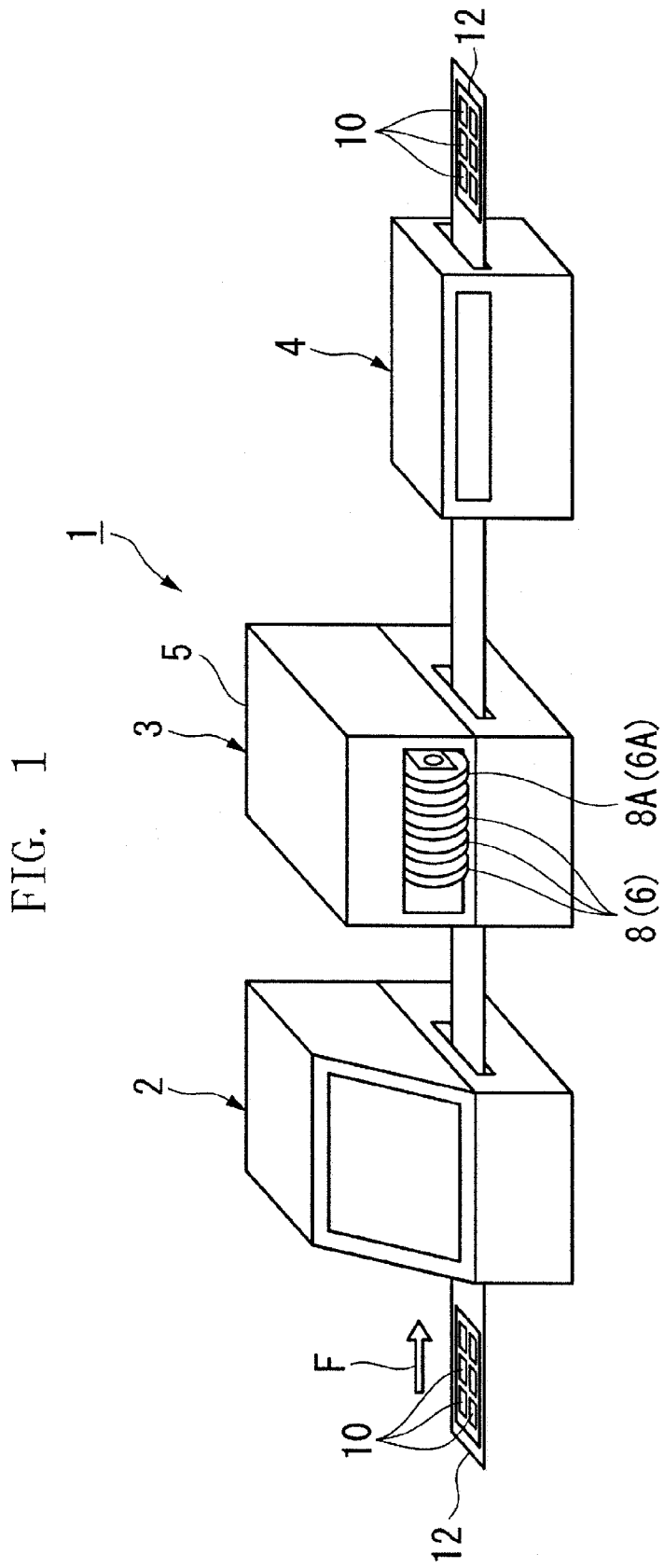
FIG. 1 is a perspective view of the mounting line in the embodiment of the present invention.

The embodiments of the present invention are described here referring to the drawings.

FIG. 1 shows the important parts in a mounting line 1 for surface mounting (hereafter referred to as "mounting") of various kinds of electronic parts (see FIG. 2) 11 such as IC chips (integrated circuits) and elements such as transistors and capacitors on thin printed circuit boards (hereafter referred to as "substrates") with a thickness of 0.01 to 1.0 mm, such as thin printed wiring boards (PWB) and flexible printed circuit (FPC) boards.

As shown in this figure, the mounting line 1 has a plurality of substrates 10 trimmed to the desired shape placed and held on one conveying carrier 12. In this form, a series of processes is performed on each substrate 10 in the mounting stage while each substrate 10 is transported on the conveying carrier 12. In the figure, the arrow F indicates the direction of transport of the substrate 10 and the conveying carrier 12.

The mounting stage mentioned above comprises a printing process for printing desired patterns of cream solder using a printing device 2 on the substrate 10 placed and held on the conveying carrier 12, a mounting process for automatically mounting various kinds of electronic parts 11 on the substrate 10 using a mounter device 3, which is an automatic electronic part loading machine, and a reflow process for heating the substrate 10 mounted with various kinds of electronic parts 11 to the predetermined temperature (220 to 280° C.) in the reflow oven, and for connecting and fixing the various kinds of electronic parts 11 through the molten cream solder. While the reflow process is implemented at a high temperature, the printing process and the mounting process are implemented under room temperature.

Each substrate 10 after undergoing the processes mentioned above is removed from the conveying carrier 12, washed and inspected, and becomes a finished product, namely an electronic circuit board.

Figure 2:
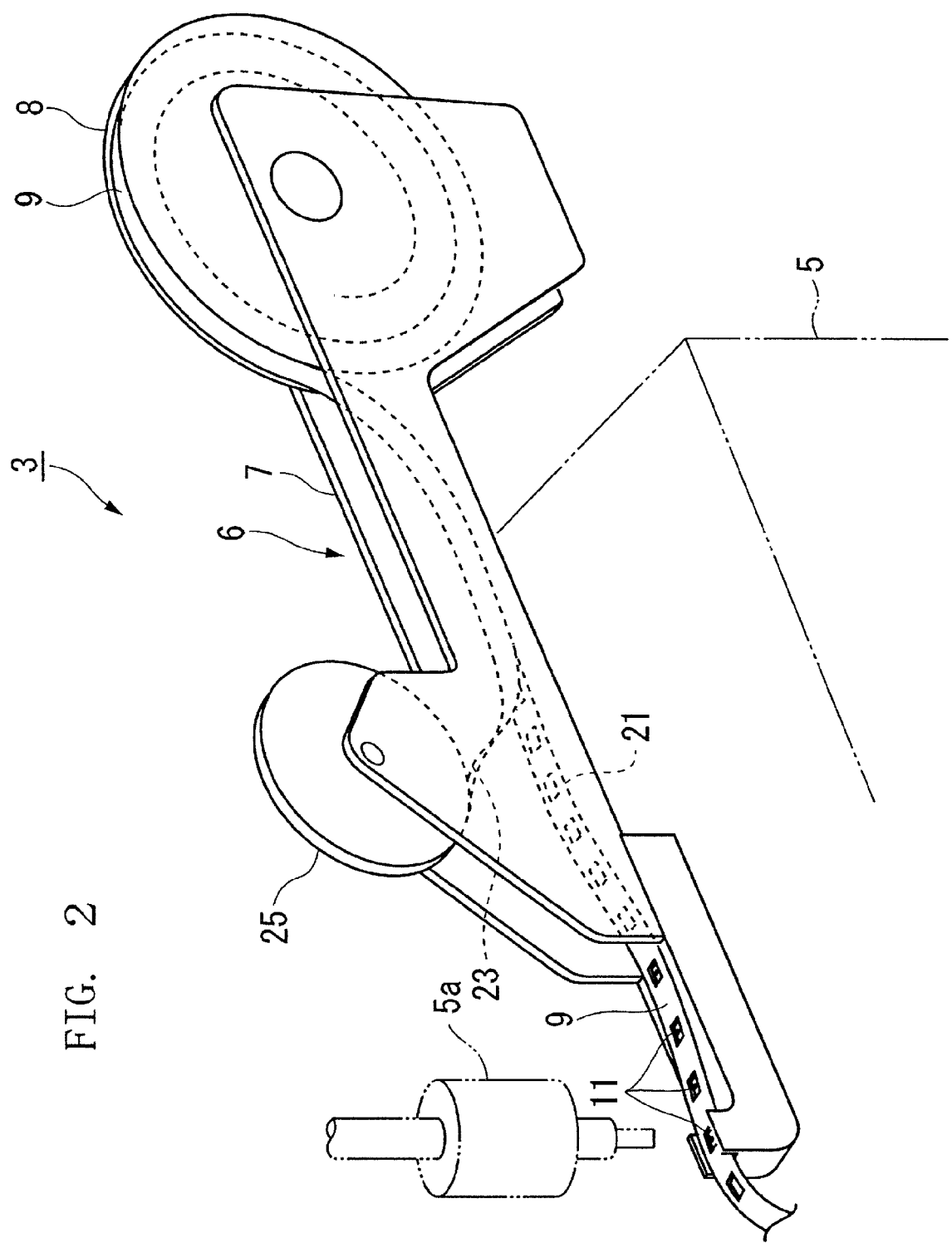
FIG. 2 is a perspective view of the parts feeder of the mounter device.

Referring to FIG. 2, the mounter device 3 is provided with a multiple parts feeder 6 that can be exchanged with the mounter body 5. Each parts feeder 6 is installed to suit each electronic part 11, and has a feeder body 7 to which a part cartridge 8 containing each electronic part 11 is exchangeably fitted. This part cartridge 8 has a case that accommodates suitable electronic parts 11 held by a guide tape 9 in the reel-wound condition.

Figure 6:
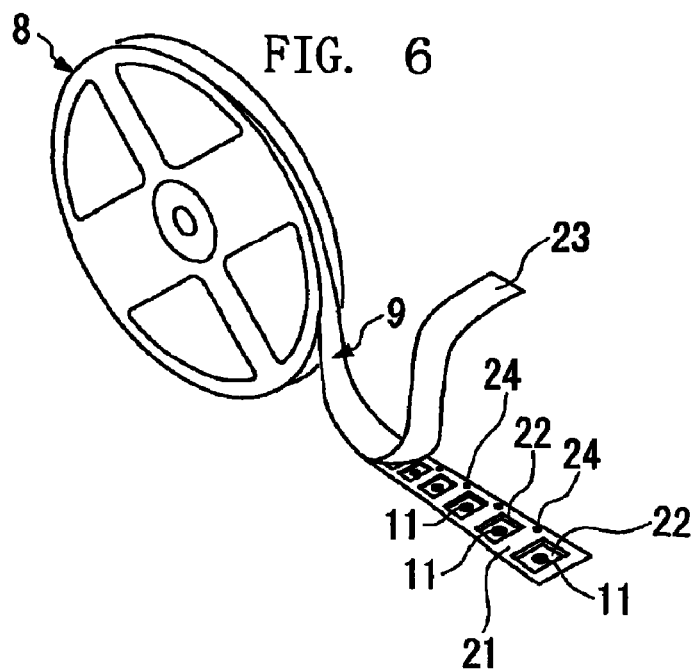
FIG. 6 is a perspective view of the part cartridge.
Figure 7:
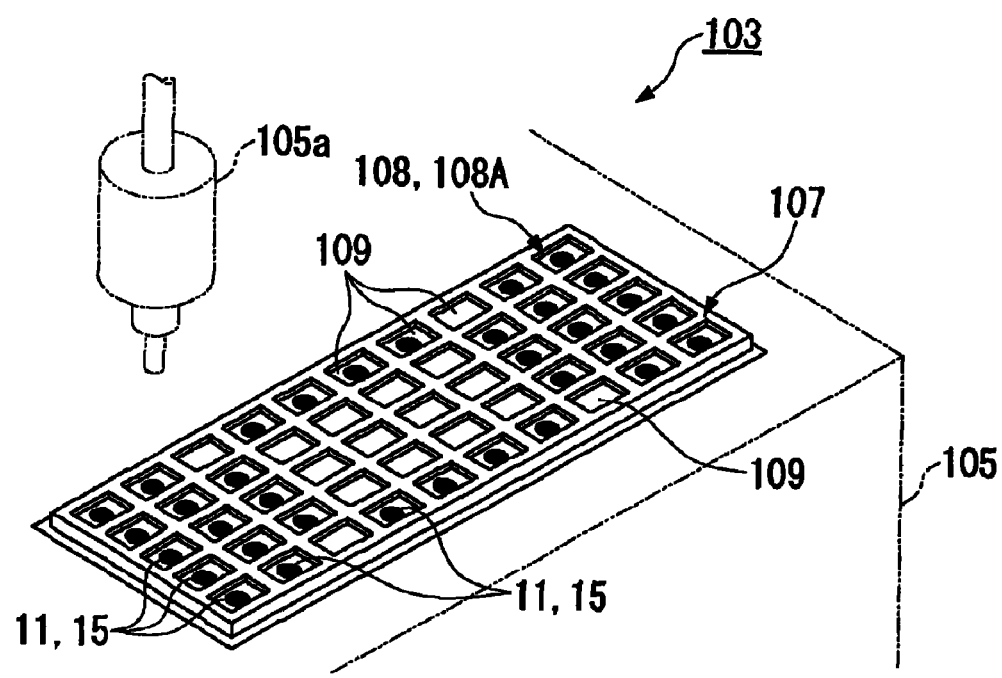
FIG. 7 is a perspective view equivalent to FIG. 2 when a tray-type part cartridge is used.

As shown in FIG. 6, the guide tape 9 comprises an embossed carrier tape 21 provided with multiple embossings (concave-shaped parts) in a row arrangement at equal spacing in the longitudinal direction and a top cover tape 23 attached to the embossed carrier tape 21 so as to seal the embossings 22. Within each embossing 22, electronic part 11 is set in an attitude (condition) that enables it to be mounted on the substrate 10, and each electronic part 11 is arranged at an equal spacing and held in the embossing within the guide tape 9. The guide tape 9 is provided with multiple feed holes in a row that enables transportation of the tape.

Also, as shown in FIG. 2, the guide tape 9 is intermittently pulled in and at the same time, the top cover tape 23 is wound over it from the reel 25 when the mounter body 5 operates. In this condition, the electronic parts 11 arranged in the guide tape 9 are positioned one by one at the parts feed position in the feeder body 7.

The electronic part 11 arranged at the parts feed position is adsorbed and held in a mount arm 5a of the mounter body 5. When this mount arm 5a activates, the electronic part 11 is moved to the specified position of substrate 10 placed and held on the conveying carrier 12 and is also mounted on the substrate 10.

The operation of the mounter device 3 together with the mount arm 5 is controlled by a control device not shown in the drawings to suit the substrate 10 and the electronic parts 11. To replenish or to replace electronic parts 11, the part cartridge 8 may be exchanged.

At least one of the parts feeders 6 is provided for supplying holding pins (holding part: see FIGS. 3 to 5), that place and hold the substrate 10 closely on a supporting surface of the conveying carrier 12, to the mounter body 5 of the mounter device 3, and is prepared as parts feeder 6A for pins, which is associatively operated by feeder body 7 and part cartridge 8A for pins (part cartridge for mounter device). The part cartridge 8A for pins is different from other part cartridge 8 in that the holding pins 15 are held in the guide tape 9 instead of the electronic parts 11 and these pins are contained in a case in the reel-wound condition.

Similar to each electronic part 11, each holding pin 15 is contained in the embossing 22 of guide tape 9 in an attitude (condition) that enables it to be fitted to the conveying carrier, and each pin is arranged in a row at equal spacing in the guide tape and held by the tape. Similar to the other part cartridge 8, with the operation of the mounter body 5, the guide tape is intermittently pulled and the top cover tape 23 is wound over by the reel 25 for winding the tape. In this condition, the holding pins 15 arranged in a row in the guide tape 9 are positioned one by one at the parts feed position in the feeder body 7. The holding pin 15 is adsorbed and held in the mount arm 5a, and when it moves to the specified position of the conveying carrier 12, it is fitted to the conveying carrier 12.

Figure 3:
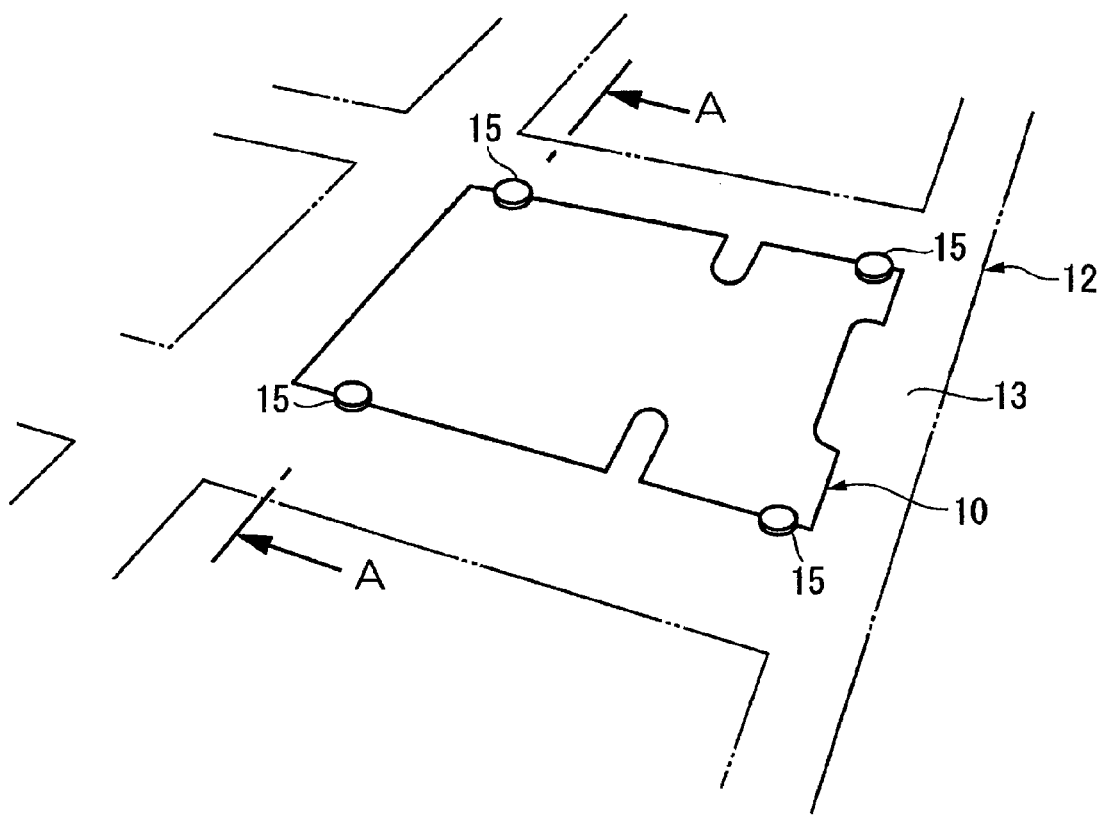
FIG. 3 is a perspective view of the substrate placed and held on the conveying carrier.

As shown in FIG. 3, the substrate 10 in this embodiment has a roughly rectangular shape, and the holding pins 15 are installed at locations near each corner of the rectangle at the fringes (outer edges) of the substrate 10 in the conveying carrier 12. The fringes of substrate 10 are held in position and restrained from being raised above the substrate supporting surface 13 of conveying carrier 12 by each of the holding pins 15 fitted to the conveying carrier 12.

Figure 4:
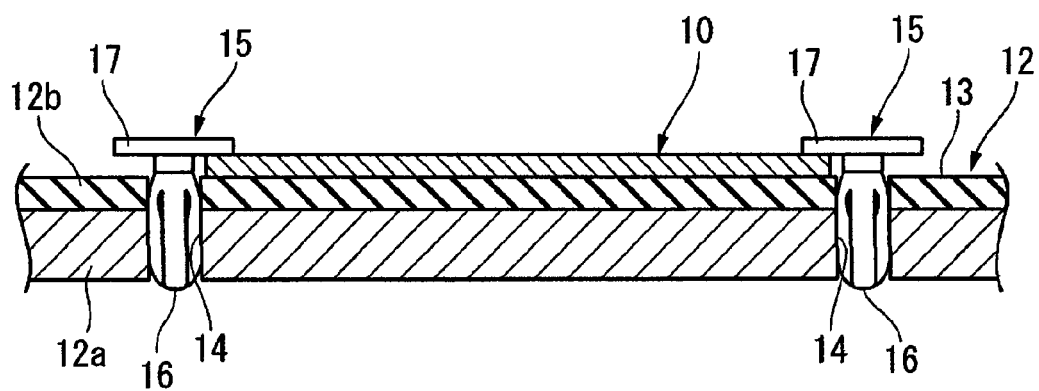
FIG. 4 is a cross section view along the line A-A in FIG. 3.

Referring to FIG. 4, through holes 14 are provided at locations outside the edges of the substrate 10 and near the corners of the substrate 10 in conveying carrier 12 to enable holding pins 15 to be fitted. On the other hand, each holding pin 15 has a leg part 16 that can be inserted in the through hole 14 of conveying carrier 12 and an umbrella-shaped head part 17 that can be installed by the side of the substrate 10 (substrate edge side) of the leg part 16. Each through hole 14 of the conveying carrier 12 is formed almost perpendicular to the substrate supporting surface 13. By inserting holding pins 15 in each of these through holes 14, the fringes of the substrate 10 are pressed down and held in place by the head part 17, thereby preventing separation, namely the rise of the fringes from the substrate supporting surface 13 of the conveying carrier. In this condition, the fringes of the substrate 10 are held between the undersurface of the head part 17 of each holding pin 15 and the substrate supporting surface 13 of the conveying carrier 12.

Here, the conveying carrier 12 may comprise a comparatively hard base material 12a made of glass-cloth epoxy resin laminate, aluminum, stainless steel or magnesium alloy, which may be coated with a comparatively soft material 12b, having tow adhesiveness satisfying a value between 10 to 1000 g/cm$^2$, such as fluoride-based or silicon based resin material. The substrate supporting surface 13 is formed by resin material 12b. The holding force that restricts the substrate 10 from being raised from above the substrate supporting surface 13 acts on the substrate 10 placed and held on the substrate supporting surface 13 because of the adhesive force of the resin material 12b. At the same time, the substrate 10 is positioned along the direction of the substrate supporting surface 13. After all processes in each stage are completed, the substrate 10 can be easily separated from the conveying carrier 12. To place and hold the substrate 10 at a predetermined position on the conveying carrier 12, a jig for mounting the substrate (not shown in the drawings) and the reference hole in the substrate 10 corresponding to the jig may be used.

Figure 5:
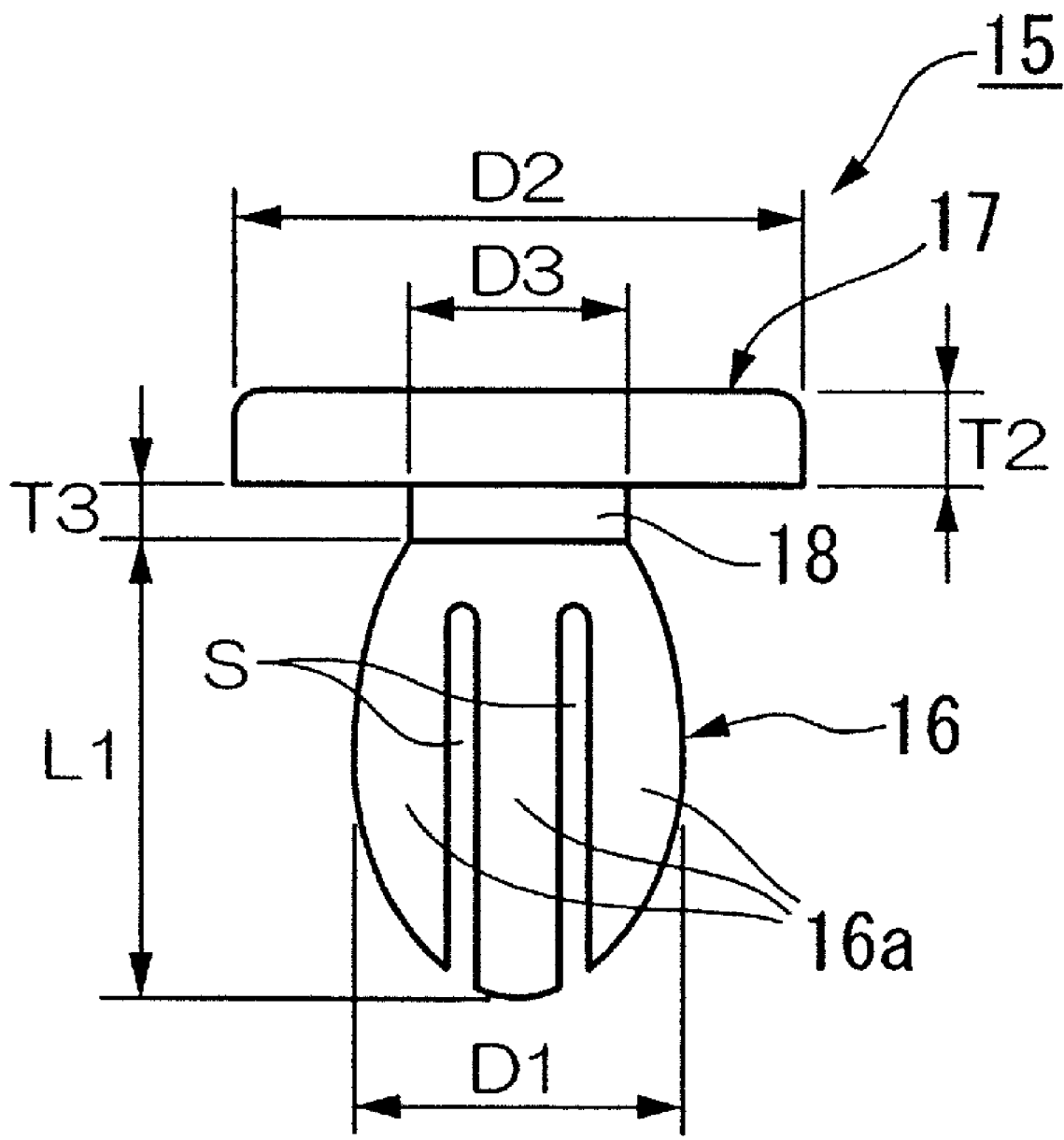
FIG. 5 is the elevation of the front view of the holding pin.

As shown in FIG. 5, the leg part 16 of the holding pin 15 has multiple latching claws 16a shaped such that their central parts in the longitudinal direction are curved approximately so as to extend outward diametrically and are provided at a specific spacing S in the circumferential direction. Each latching claw 16a has spring-like properties. While the claws deform elastically and displace so as to reduce the spacing S, the diameter of the leg part 15 can be reduced. The maximum diameter of the leg part 16 before reduction in diameter has been set such that it is greater than the inside diameter of the through hole 14 of the conveying carrier 12. This leg part 16 is brought into sliding contact elastically with the inside surface of through hole 14 of each latching claw 16a, and inserted in the through hole 14. As a result, a predetermined latching force is generated between the holding pin 15 and the conveying carrier 12, and the substrate 10 is held in position at its fringes by the combined latching force and the adhesive force of the conveying carrier 12.

The length and the maximum diameter of the leg part 16 of the holding pin 15 have been set to suit the through hole 14 of the conveying carrier 12. An example of these dimensions is: length L of leg part 16 is approximately 1.25 mm, its maximum diameter D1 is approximately 1.2 mm, corresponding to the inside diameter of through hole 14 of approximately 1 mm. At this stage, the diameter D2 of the head part 17 of the holding pin 15 was taken as about 15 mm, and the thickness T2 of the head part 17 was taken as approximately 1 mm so as to have adequate holding strength to hold the substrate 10 fitted to the conveying carrier 12. At a location on the side of the undersurface (side of leg part 15) of head part 17, a disc-shaped seat 18 with thickness T3 equivalent to that of the substrate 10 (for instance, 0.45 mm) is provided with the leg part 16 extending below its undersurface. The diameter D3 of seat 18 is approximately 0.9 mm.

Such a holding pin 15 should preferably be made of a thermoplastic resin such as polystyrol or acrylic resin, or thereto-setting resin such as polyacetal or epoxy resin, or made of a metal such as stainless steel or aluminum, and should preferably be heat resistant and pliable. In addition to the characteristics mentioned above, the holding pin should preferably have conductivity that prevents electrification due to static electricity. In the embodiment, each holding pin is fitted to the conveying carrier 12 automatically at high speed using the existing mounter device 3 during the mounting process, which is a process before the reflow process. To remove each holding pin 15 from the conveying carrier 12, a push-out jig (not shown in the drawings) having a push-out pin to suit each holding pin may be used for pushing out the leg part 16 of each holding pin 15 from the through hole 14 out of the undersurface of the conveying carrier 12.

If the tip of the push-out pin is set such that it pushes against the undersurface of head part 17 (seat 18) rather than the tip of each claw of the holding pin 15, then each holding pin 15 can be smoothly removed without crushing any of the latching claws 16a. As described above, after the part cartridge 8A in the embodiment above is mounted with electronic parts 11 by the mounter device 3 in the substrate 10 placed and held on the conveying carrier 12, the substrate 10 is heated to the predetermined temperature so that it can be used in the mounting process in which electronic parts 11 are mounted on the substrate 10. To enable the holding pins 15 which hold the substrate 10 in close contact with the conveying carrier 12 to be fitted to the conveying carrier 12 by the mounter device 3, the holding pins 15 held in the guide tape 9 are stored in the reeled condition together with the guide tape.

By using the part cartridge 8A for the above-mentioned pins and the mounter device 3 formed by fitting the part cartridge 8A, the method of holding and carrying substrates in which the holding pins 15 are automatically and speedily fitted by the mounter device 3 to the conveying carrier 12 can be adopted.

According to the method of holding and carrying substrates mentioned above, even if thermal stresses occur in the substrate 12 during heating, since the substrate 10 is held in close contact with the conveying carrier 12 by the holding pins 15, the rise of the substrate 10 from the conveying carrier 12, or the deflection of the substrate 10 can be securely prevented.

Considering the environmental measures that are frequently adopted in recent years in electronic circuit boards, such as the use of the so-called halogen-free substrates not containing halogen-based fire-retarding materials such as bromine and chlorine, or the use of the so-called lead-free solder not containing lead (Pb), the halogen-free substrate is likely to deflect during reflow, and the melting temperature of the lead-free solder is high (250 to 280° C.), therefore, the measures are disadvantageous from the aspect of preventing deflection of the substrate.

However, if the method of holding and carrying the substrate mentioned above is used, even if electronic circuit boards are manufactured using halogen-free substrates or very thin substrates in which deflection is likely to occur during heating, or using lead-free solder in which the melting temperature is high, the deflection of the substrates can be securely prevented; therefore, the yield can be improved and the manufacturing cost can be restricted.

Also, in the method of holding and carrying substrate mentioned above, the holding pins 15 are inserted while they are brought into sliding contact elastically with the conveying carrier 12, and the configuration is such that a predetermined latching force is generated between the conveying carrier 12 and the holding pins 15. Thus if the latching force mentioned above is set such that the substrate 10 can be held by a holding force that exceeds the force generated by the thermal stresses in the substrate 10 during heating, the deflection of the substrate 10 can be prevented, and the holding pins 15 can be easily attached and removed to/from the conveying carrier 12.

Furthermore, if a configuration of holding pins 15 to hold the fringes of the substrate 10 is selected in the method of holding and carrying substrate mentioned above, the fringes of the substrate 10 which were likely to be raised above the conveying carrier 12, can be properly held in close contact with the conveying carrier 12, and the occurrence of deflection in the substrate 10 can be effectively prevented.

The electronic circuit board formed by mounting electronic parts on the substrate 10 can be manufactured by using existing mounting lines and devices, and at the same time, the holding pins 15 can be automatically fitted at high speed using the existing mounter device 3.

Since a series of processes such as the printing process, mounting process and the reflow process are performed in the mounting line 1, introducing the process of fitting holding pins 15 between these processes will result in large changes in the existing mounting line 1 and, is therefore, not preferred. The bolding pins 15 may be fitted before the printing process as in the conventional method of securing the substrate 10 using tape, but the thickness of head part 17 of holding pin 15 is significantly larger than the thickness of tape mentioned above (about 80 µm), which obstructs cream solder printing and increases the working man-hours similar to the conventional method using tape.

Consequently, the method of holding and carrying substrate mentioned above in which the holding pins 15 for holding the substrate 10 are fitted using the existing mounter device 3, is extremely effective because it leads to suppression of equipment costs and increase in productivity.

Note that the present invention is not limited to the embodiments mentioned above. For instance, in the mounter device 103 shown in FIG. 6, instead of the parts feeder 6, a tray-type part cartridge 108 containing multiple electronic parts 11 in the tray unit 107 may be fitted. Multiple depressions 109 are provided in proximity in a row arrangement on the mounting surface of the part in the tray unit, and electronic parts of the same type or of different types are set in these depressions 109. Each electronic part in this condition is directly adsorbed and held by mounting arm 105a of the mounter 10, moved to the specified position of the substrate 10 and mounted on the substrate 10. Among one of these part cartridges 108, is a part cartridge for pin 108A (part cartridge for mounter device) containing holding pins 15 instead of electronic parts 11.

Each holding pin 15 is not inserted at a location outside of the fringe of the substrate 10 in the conveying carrier 12, but it may be inserted in the conveying carrier 12 through the fringe of the substrate 10. For this purpose, the reference hole (for instance hole with diameter 3.2 mm or 4 mm) used for positioning the substrate 10 in the conveying carrier 12 maybe used as the through hole of holding pin 15 in the substrate 10.

Furthermore, an arm-shaped object that extends from the substrate edge part of leg part 16 may be set as the part that restrains the separation of the substrate 10 at the holding pin 15 from the conveying carrier 12, instead of the umbrella-shaped head part 17.

Moreover, the holding pins 15 may be arranged such that they hold the inside edges of slit or hole provided in the substrate 10. Here, when the substrate 10 is in the base substrate form before it is formed as a substrate, and even when it is held in conveying carrier 12, holding pins 15 may be disposed so as to hold this base substrate using fringes of the substrate and the inside edges of the provided holes or slits, without being limited to individual substrates or piece substrates.

The conveying carrier 12 may be positioned along the direction of the substrate supporting surface 13 by the holding pins 15, for instance, instead of using the method of adhesion and holding of the substrate 10 by the conveying carrier 12. In this case, either the holding pins 15 should preferably be fitted to the conveying carrier 12 before mounting the electronic parts 11, or tape or other means should be used to fix the substrate 10 to the conveying carrier 12 beforehand.

Furthermore, instead of accommodating electronic parts or holding pins in the embossings 22 by a guide tape, they may passed through an adhesive layer or may be inserted, and in a guide tape.

The holding part for holding the substrate 10 is not limited to a holding pin, but a snap button or even a thumbtack may be used.

The configuration in the embodiment mentioned above is one example; various changes may be effected to the present invention without departing from the spirit and scope of the present invention.

INDUSTRIAL APPLICABILITY

According to the present invention, even during the manufacture of electronic circuit boards using very thin boards or halogen-free boards (substrate) that are likely to deflect during heating, or using lead-free solder with high melting temperatures, the deflection of the substrate can be securely prevented, the yield can be improved and the manufacturing costs can be restricted.

Moreover, the electronic circuit boards can be manufactured as mentioned above, using the existing mounting lines and devices, and the holding parts can be fitted using mounter device automatically and at high speed, therefore, efficiency of production can be improved by restricting the equipment costs.

What is claimed is:

1. A method for holding and carrying substrate used in a mounting process for mounting electronic parts on a substrate by heating the substrate to a predetermined temperature after mounting the electronic parts on the substrate placed and held on a conveying carrier by a mounter device, the method comprising:
    deforming a leg part of a holding part so as to reduce a diameter of the leg part by inserting the leg part in a through hole provided in the conveying carrier; and
    holding the substrate in close contact with the conveying carrier by pressing down the substrate by a head part of the holding part while pressing an inner wall of the through hole by the leg part, the head part being provided at an end of the leg part.

2. The method for holding and carrying substrate according to claim 1, wherein the holding part is brought into sliding contact elastically with the conveying carrier while inserting the holding part to generate a predetermined latching force between the holding part and the conveying carrier.

3. The method for holding and carrying substrate according to claim 1 or claim 2 wherein the holding part is fitted to hold the fringes of the substrate.

4. The method for holding and carrying substrate according to claim 1, wherein the deforming the leg part includes displacing lathing claws of the leg part, which are provided at a spacing to each other, so as to reduce the spacing.

* * * * *